United States Patent [19]

Venkatesan et al.

[11] Patent Number: 5,627,097
[45] Date of Patent: May 6, 1997

[54] METHOD FOR MAKING CMOS DEVICE HAVING REDUCED PARASITIC CAPACITANCE

[75] Inventors: Suresh Venkatesan; Stephen Poon; Jeffrey Lutze, all of Austin, Tex.

[73] Assignee: Motorola, Inc., Schaumburg, Ill.

[21] Appl. No.: 498,709

[22] Filed: Jul. 3, 1995

[51] Int. Cl.$^6$ ............................................. H01L 21/70
[52] U.S. Cl. ........................ 438/217; 438/222; 438/224; 438/232
[58] Field of Search ....................... 437/40, 41, 56, 437/57, 58, 89, 63, 67, 29

[56] References Cited

U.S. PATENT DOCUMENTS

| | | | |
|---|---|---|---|
| 3,948,694 | 4/1976 | Mills, III | 437/63 |
| 4,830,980 | 5/1989 | Hsieh | 437/56 |
| 4,845,537 | 7/1989 | Nishimura et al. | 357/23.4 |
| 4,864,374 | 9/1989 | Banerjee | 357/23.6 |
| 4,868,135 | 9/1989 | Ogura et al. | 437/56 |
| 4,874,718 | 10/1989 | Inoue | 437/62 |
| 4,902,639 | 2/1990 | Ford | 437/56 |
| 4,957,874 | 9/1990 | Soejima | 437/56 |
| 4,963,502 | 10/1990 | Teng et al. | 437/56 |
| 5,015,594 | 5/1991 | Chu et al. | 437/57 |
| 5,108,945 | 4/1992 | Matthews | 437/41 |
| 5,110,757 | 5/1992 | Arst et al. | 437/89 |
| 5,124,768 | 6/1992 | Mano et al. | 357/23.7 |
| 5,137,837 | 8/1992 | Chang et al. | 437/56 |
| 5,158,900 | 10/1992 | Lau et al. | 437/56 |
| 5,166,084 | 11/1992 | Pfiester | 437/40 |
| 5,273,921 | 12/1993 | Neudeck et al. | 437/89 |
| 5,336,926 | 8/1994 | Matthews | 437/56 |
| 5,453,390 | 9/1995 | Nishizawa et al. | 437/58 |
| 5,504,364 | 4/1996 | Chang et al. | 437/57 |

OTHER PUBLICATIONS

Kusunoki, et al., "Hot-Carrier-Resistant Structure by Re-Oxidized Nitrided Oxide Sidewall for Highly Reliable and High Performance LDD MOSFETs", 1991 IEEE, pp. 25.4.1–25.4.4.

Wen, et al., "A Fully Planarized 0.25 μm CMOS Technology", pp. 83–84.

Tsui, et al., "Poly Reoxidation Time and Temperature Effects on Reverse Short Channel Characteristics", pp. 1–13.

Shimizu, et al., "0.15 μm CMOS Process for High Performance and High Reliability", 1994 IEEE, pp. 4.1.1–4.1.4.

Inaba, et al., "Inverter Performance of 0.10μm CMOS Operating at Room Temperature", Dec. 1994 IEEE Transactions On Electron Devices, vol. 41, No. 12, pp. 2399–2404.

Lee, et al., "Room Temperature 0.1μm CMOS Technology With 11.8 ps Gate Delay", 1993 IEDM, pp. 6.5.1–6.5.4.

Lee et al., "A New 0.25-μm Recessed-Channel MOSFET with Selectively Halo-Doped Channel and Deep Graded Source/Drain", Dec. 1993 IEEE Electron Device Ltrs., vol. 14, No. 12, pp. 578–580.

Mikosha, et al., "A Novel CMOS Process Utilizing After-Gate-Implantation Process", pp. 41–42.

Yoshimura, et al., "New CMOS Shallow Junction Well FET Structure (CMOS-SJET) for Low Power-Supply Voltage", 1992 IEDM, pp. 35.8.1–35.8.4.

(List continued on next page.)

Primary Examiner—Jey Tsai
Assistant Examiner—Long Pham

[57] ABSTRACT

A CMOS device having reduced parasitic junction capacitance and a process for fabrication of the device. The device includes an a portion (20') of an undoped epitaxial layer (20) vertically separating source and drain regions (52 and 53, 54 and 55) from buried layers (16, 18) formed in a semiconductor substrate (12). The undoped epitaxial layer (20) reduces the junction capacitance of the source and drain regions by providing an intrinsic silicon region physically separating regions of high dopant concentration from the source and drain regions. Additionally, MOS transistors fabricated in accordance with the invention have fully self-aligned channel regions extending from the upper surface (22) of the undoped epitaxial layer (20) to the buried layers (16, 18) residing in the semiconductor substrate (12).

13 Claims, 4 Drawing Sheets

OTHER PUBLICATIONS

Pfiester, et al., "A Self–Aligned LDD/Channel Implanted ITLDD Process with Selectively Deposited Poly Gates for CMOS VLSI", 1989 IEEE, pp. 32.2.1–32.2.4.

Pfiester, et al., "An ITLDD CMOS Process with Self–Aligned Reverse–Sequence LDD/Channel Implantation", Nov. 1991 IEEE Transactions On Electron Dev., vol. 38, No. 11, pp. 2460–2464.

Nguyen, et al., "Quasi–'SOI MOSFETs Using Selective Epitaxy and Polishing", 1992 IEEE, pp. 13.2.1–13.2.4.

METHOD FOR MAKING CMOS DEVICE HAVING REDUCED PARASITIC CAPACITANCE

RELATED APPLICATION

Related subject matter is disclosed in the commonly-assigned patent application entitled "Process for Fabricating a Fully Self-Aligned SOI MOS FET" having U.S. Ser. No. 08/497,317 and filed on even date.

FIELD OF THE INVENTION

This invention relates, in general, to a semiconductor device and a method for its fabrication, and more particularly, to a CMOS device incorporating epitaxial silicon layers and to a method for fabricating such a CMOS device.

BACKGROUND OF THE INVENTION

In order to provide increased functional capability, integrated circuit devices are continually redesigned to smaller and smaller geometric dimensions. Although reducing transistor dimensions increases the functional performance of an integrated circuit, transistors can suffer a loss of performance when scaled to dimensions below one micron. The performance loss is especially acute in complementary-metal-oxide-semiconductor (CMOS) devices, which contain large numbers of diffused junctions.

As CMOS devices are continually scaled to dimensions below one micron, device reliability dictates a concomitant reduction in the power supply voltage. However, the reduction in physical dimensions coupled with the reduction in power supply voltage effectively reduces the transistor current. At reduced current levels, parasitic capacitances, such as drain junction capacitance and gate overlap capacitance, become significant factors contributing to low operating speed in transistor devices.

Performance degradation arising from short-channel effects represents an additional problem encountered as device dimensions are scaled below one micron. In particular, threshold voltage instability and current leakage can occur across the channel region of a metal-oxide-semiconductor (MOS) transistor having an effective channel length below one micron. Short-channel effects are typically addressed by selectively doping portions of the channel region, and by providing source and drain extensions adjacent to the channel region. Additionally, the substrate doping is often adjusted to compensate for the additional channel doping used to combat the short-channel effects.

While increased doping of the substrate and the channel region forestalls the onset of short-channel behavior in sub-micron CMOS devices, the additional dopants increase parasitic capacitances in the device. One solution to the parasitic capacitance problem is the fabrication of transistor devices in a silicon-on-insulator (SOI) substrate. The buried oxide layer of the SOI substrate effectively separates the junctions associated with the transistors from the underlying semiconductor substrate. The junction capacitance is reduced by increasing the separation distance between regions of high dopant concentration. For example, the buried oxide layer in an SOI device separates active transistor regions from the silicon substrate, thus reducing junction capacitance. Although buried oxide layers are effective at reducing junction capacitance, SOI substrates are expensive to produce and increase the unit cost of CMOS devices fabricated in SOI substrates. Accordingly, a need existed for a CMOS device and fabrication process using conventional silicon technology, yet achieving reduced junction capacitance at device geometries below one micron.

SUMMARY OF THE INVENTION

In practicing the present invention there is provided a CMOS device having reduced junction capacitance and a process for the fabrication of the device. The junction capacitance is reduced by eliminating well regions typically used in CMOS device fabrication for electrical isolation of MOS transistors. In the present invention, intrinsic silicon is provided below the source and drain regions of N-channel and P-channel transistors. The intrinsic silicon vertically separates the source and drain regions of the MOS transistors from buried layers underlying the transistors.

In one embodiment of the invention, a semiconductor substrate is provided having an undoped epitaxial layer overlying a buried layer. A masking layer is formed on the undoped epitaxial layer. The masking layer has an opening therein exposing a channel portion of the undoped epitaxial layer. The channel portion is doped with a dopant of a first conductivity type using the opening in the masking layer as a doping mask. A gate electrode is formed in the opening and source and drain regions are formed in the undoped epitaxial layer on either side of the gate electrode. The source and drain regions are formed such that a portion of the undoped epitaxial layer vertically separates the source and drain regions from the buried layer. By removing regions of high dopant concentration away from the source and drain junctions, the junction capacitance is minimized. The reduction of junction capacitance results in higher operating speed for both N-channel and P-channel transistors fabricated in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention provides a CMOS device, and process for fabricating the device, having high operating speed at supply voltages of less than 5 volts. Integrated circuits incorporating the device of the invention exhibit reduced stage delay at operating voltages in the range of about 3.3 to about 1.8 volts. Improved operational speed is obtained through a reduction in the junction capacitance and the overlap capacitance of transistors fabricated in accordance with the invention. Reduced junction capacitance is obtained by elimination of the well region employed in CMOS devices of the prior art. The well region is replaced by buried layers within the substrate that are separated from the source and drain regions by fully-depleted, undoped silicon. Additionally, the process of the invention provides CMOS transistors having fully self-aligned channel regions under the gate electrode. The fabrication of CMOS transistors having fully self-aligned channel regions further reduces the junction capacitance of the device. These and other advantages of the invention will become more fully understood following a description of one embodiment of a fabrication process in accordance with the invention.

Figure 1:
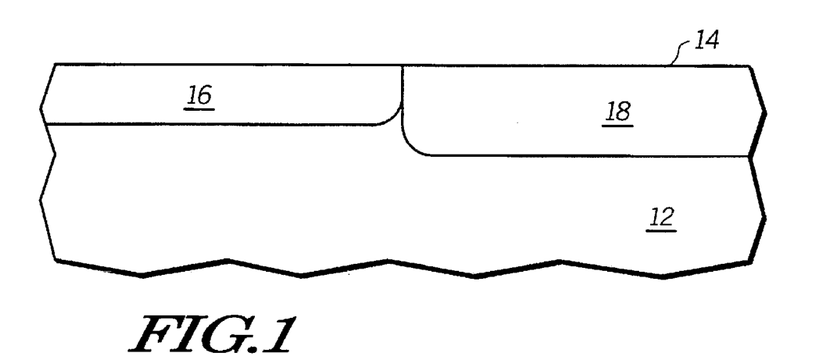
FIGS. 1–9 illustrate, in cross-section, process steps for the fabrication of a CMOS device in accordance with one embodiment of the invention.

Shown in FIG. 1, in cross-section, is a portion of a semiconductor substrate 12. Electrical isolation of CMOS transistors to be fabricated on substrate 12 is provided, in part, by two buried layers formed at a surface 14 of semiconductor substrate 12. Those skilled in the art will appreciate that in the fabrication of CMOS devices, it is necessary to provide isolation for an N-type device residing in a semiconductor substrate adjacent to a P-type device. The isolation of adjacent devices of opposite conductivity type requires that electrical isolation structures of a specific conductivity type be formed. Accordingly, for the purpose of illustration, a first buried layer 16 is an N+ buried layer, and a second buried layer 18 is a P+ buried layer. Furthermore, those skilled in the art will appreciate that the specific conductivity type of each buried layer is dependent upon the corresponding conductivity type of the MOS transistor to be fabricated above each buried layer. Although the present embodiment illustrates paired N-channel and P-channel transistors, individual transistors can be fabricated by the process of the invention. In the present embodiment, semiconductor substrate 12 is a P-type semiconductor material.

In one method, first and second buried layers 16 and 18 are formed by ion implantation of dopants into semiconductor substrate 12. A photolithographic mask is placed on surface 14 and N-type dopants, such as arsenic or phosphorous, are implanted into substrate 12 to form first buried layer 16. Then, a second photolithographic mask is placed on surface 14 and P-type dopants are implanted into semiconductor substrate 12 to form second buried layer 18.

Figure 2:
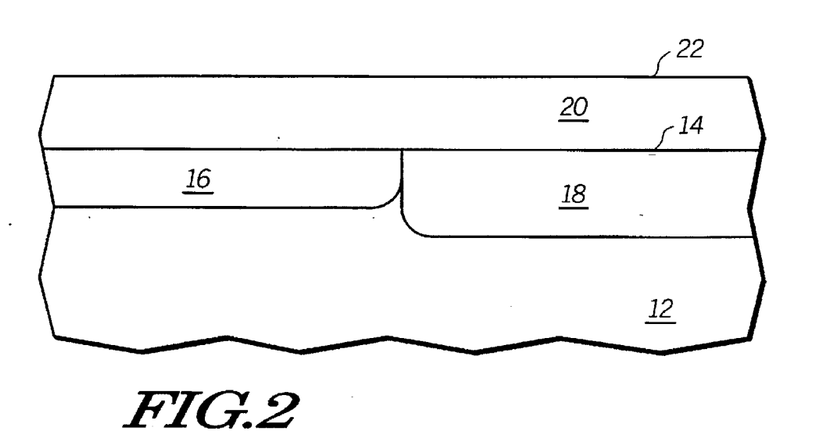

After forming first and second buried layer 16 and 18, an undoped epitaxial layer 20 is deposited to overlie surface 14, as illustrated in FIG. 2. Undoped epitaxial layer 20 is preferably deposited to a thickness of about 1 to 2 microns. The deposition of undoped epitaxial layer 20 onto surface 14 forms a structure in which first and second buried layers 16 and 18 are spaced away from an upper surface 22 of undoped epitaxial layer 20. Those skilled in the art will recognize that first and second buried layers 16 and 18 can also be fabricated after the deposition of undoped epitaxial layer 20 by using a high voltage ion implant process. Where a high-voltage implant process is used, a photolithographic mask is placed on upper surface 22 and dopants are implanted through undoped epitaxial layer 20 and into semiconductor substrate 12.

Figure 3:
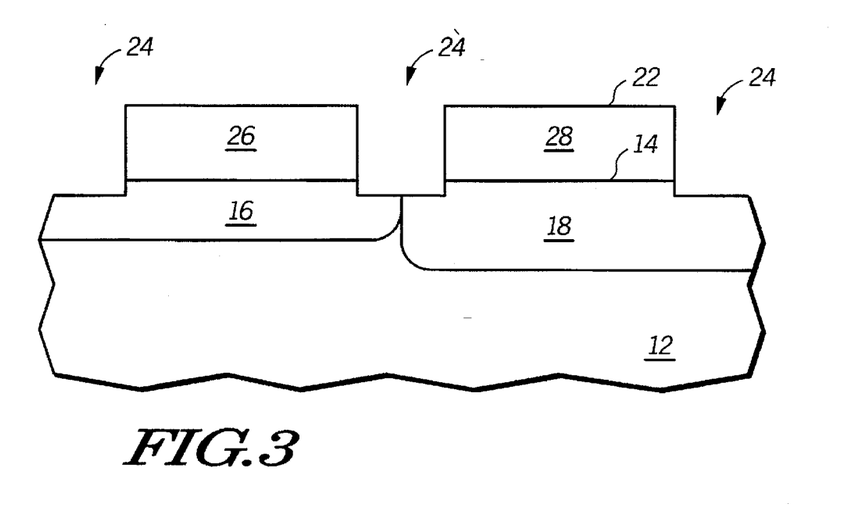

Following the formation of undoped epitaxial layer 20, a plurality of trenches 24 are formed in undoped epitaxial layer 20, as illustrated in FIG. 3. Trenches 24 are formed by placing a photolithographic mask on upper surface 22, then anisotropically etching undoped epitaxial layer 20. The etching process partitions undoped epitaxial layer 20 into a first active region 26 and a second active region 28.

Once trenches 24 are formed, a plurality of dielectric isolation regions 30 are fabricated within the trenches 24. Preferably, dielectric isolation regions 30 are formed by the deposition of a dielectric 2material, such as silicon dioxide, onto upper surface 22 and filling trenches 24. Next, a planarization process is carried out to remove dielectric material overlying upper surface 22, and leaving dielectric material in trenches 24. The planarization process forms a smooth surface across dielectric isolation regions 30 continuous with upper surface 22.

Figure 4:
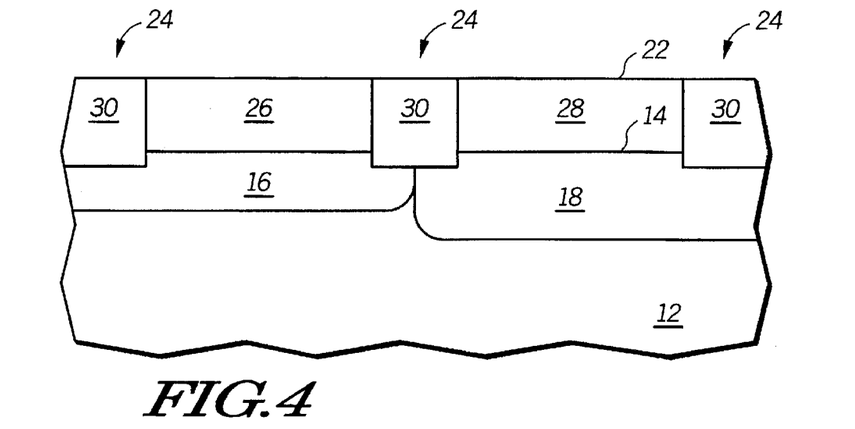

Upon formation of dielectric isolation regions 30, active regions 26 and 28 are electrically isolated from substrate 12, and from each other. As illustrated in FIG. 4, first buried layer 16 resides below first active region 26 and electrically separates first active region 26 from substrate 12. Additionally, dielectric isolation regions 30 bound first active region 26 electrically separating first active region 26 from remaining portions of undoped epitaxial layer 20. Correspondingly, second buried layer 18 resides below second active region 28 and electrically separates second active region 28 from semiconductor substrate 12. Also, dielectric isolation regions 30 bound second active region 28 and electrically separate second active region 28 from remaining portions of undoped epitaxial layer 20.

Figure 5:
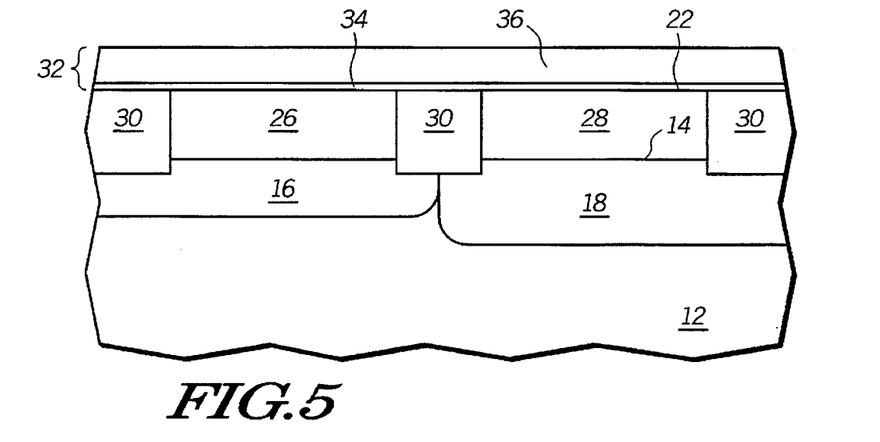

Referring to FIG. 5, a masking layer 32 is formed to overlie upper surface 22. Masking layer 32 includes a pad oxide layer 34 in contact with upper surface 22 and with dielectric isolation regions 30, and a silicon nitride layer 36 overlying pad oxide layer 34. In masking layer 32, pad oxide layer 34 is differentially etchable with respect to silicon nitride layer 36. Accordingly, pad oxide layer 34 provides an etch-stop layer upon which silicon nitride layer 36 can be selectively patterned. Additionally, pad oxide layer 34 provides a buffer layer over first and second active regions 26 and 28, which prevents contamination of first and second active regions 26 and 28 during subsequent processing. Although masking layer 32 is preferably a composite material, another material, which is differentially etchable with respect to silicon and silicon dioxide can also be employed.

Figure 6:
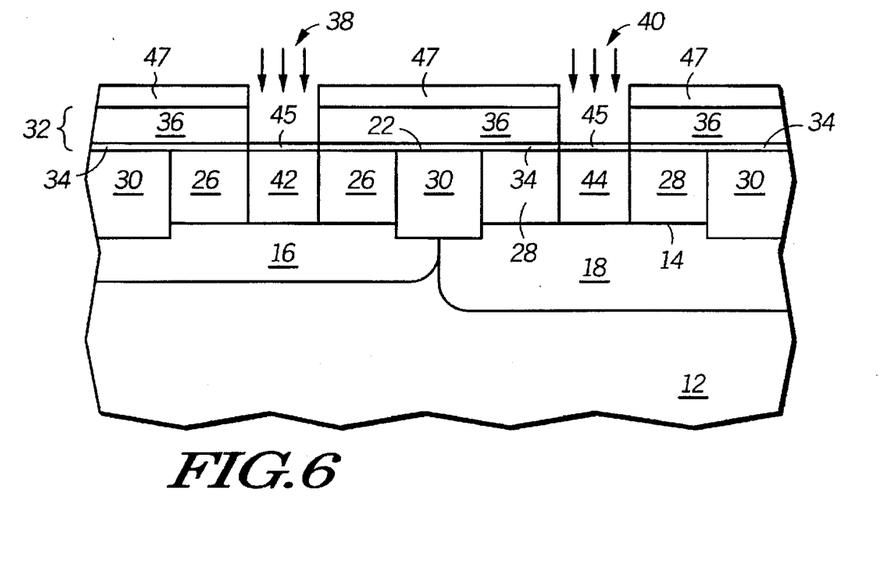

Once masking layer 32 is formed, the masking layer is patterned to form openings 38 and 40, as illustrated in FIG. 6. Openings 38 and 40 are positioned to expose channel regions 42 and 44 in active regions 26 and 28, respectively. Openings 38 and 40 are formed by placing a lithographic mask 47 on silicon nitride layer 36 and etching silicon nitride layer 36. Then, dopants are selectively implanted into active regions 26 and 28 through openings 38 and 40. An N-type dopant, such as phosphorous or arsenic, is selectively implanted through opening 38 to form channel region 42 in first active region 26. Correspondingly, a P-type dopant such as boron, is implanted through opening 40 into second active region 28 to form channel region 44 in second active region 28. The selective implants are accomplished by masking off remaining portions of substrate 12 prior to performing each selective implant. Following the ion implant process, channel regions 42 and 44 are precisely self-aligned to openings 38 and 40, respectively. Channel regions 42 and 44 are both bounded by intrinsic silicon in the remaining portions of active regions 26 and 28. Preferably, channel regions 42 and 44 extend from upper surface 22 to first and second buried layers 16 and 18, respectively.

Figure 7:
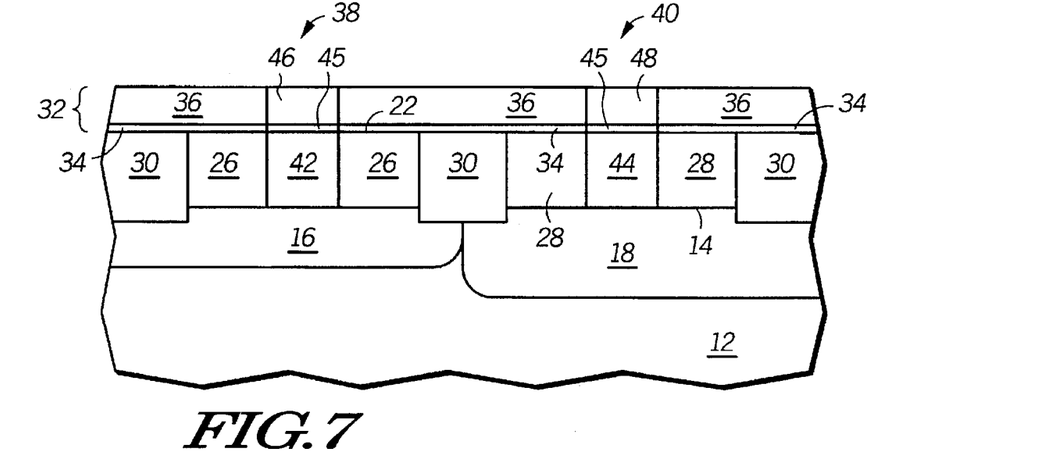

After forming channel regions 42 and 44, first and second gate electrodes 46 and 48 are formed in openings 38 and 40, respectively, as illustrated in FIG. 7. Gate electrodes 46 and 48 are preferably formed by depositing a gate forming material to overlie masking layer 32 and fill openings 38 and 40. Then, a planarization process is carried out to remove the gate forming material from the upper surface of masking layer 32, and to leave portions of the gate forming material in openings 38 and 40. Preferably, the gate forming material is polycrystalline silicon. Alternatively, another electrically conductive or semiconductive material can be used. For example, first and second gate electrodes 46 and 48 can be formed with a refractory metal, such as titanium, tungsten, molybdenum, and the like. Alternatively, the gate forming material can be a refractory metal silicide, such as titanium silicide, tungsten silicide, and the like.

It is important to note that the process used to fabricate first and second gate electrodes 46 and 48 does not include a critical lithographic alignment step. The gate electrodes are fully self-aligned to channel regions 42 and 44 through openings 38 and 40, respectively. After completing the implant process to form channel regions 42 and 44, portions of pad oxide layer 34 exposed by openings 38 and 40 are removed. Then, an oxidation process is carried out to form a gate dielectric material 45 overlying channel regions 42 and 44.

Figure 8:
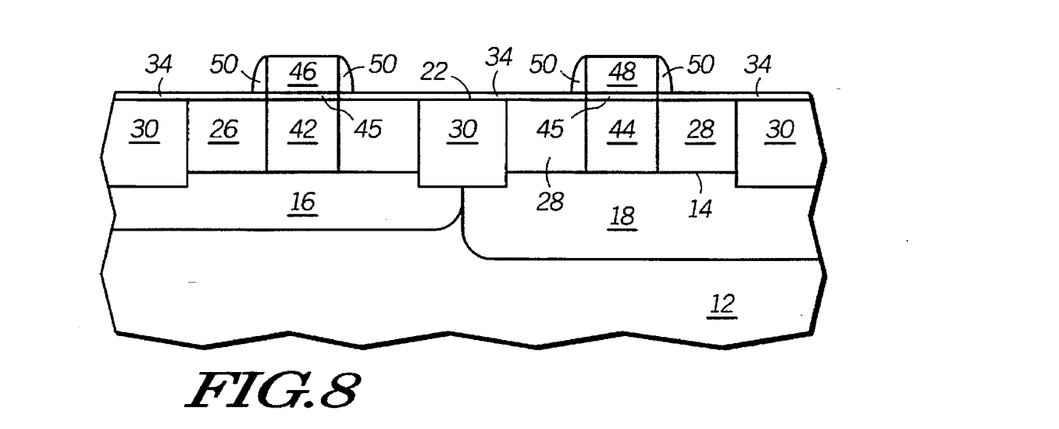

Referring to FIG. 8, the fabrication of first and second gate electrodes 46 and 48 is completed by removing silicon nitride layer 36 and forming insulating sidewall spacers 50. In one method, silicon nitride is deposited to overlie first and second gate electrodes 46 and 48. Then, the silicon nitride is anisotropically etched to form sidewall spacers 50 adjacent to the vertical edges of first and second gate electrodes 46 and 48. Although not shown in FIG. 8, source drain extension regions can be formed in active regions 26 and 28 prior to the formation of sidewall spacers 50. The source and drain extension regions are preferably formed by a low dose, low energy ion implantation of P-type dopants into active region 26 and N-type dopants into active region 28. Once the implants are complete, sidewall spacers 50 are formed. In this context, sidewall spacers 50 will become an implant mask for the subsequent formation of heavily-doped source and drain regions.

Figure 9:
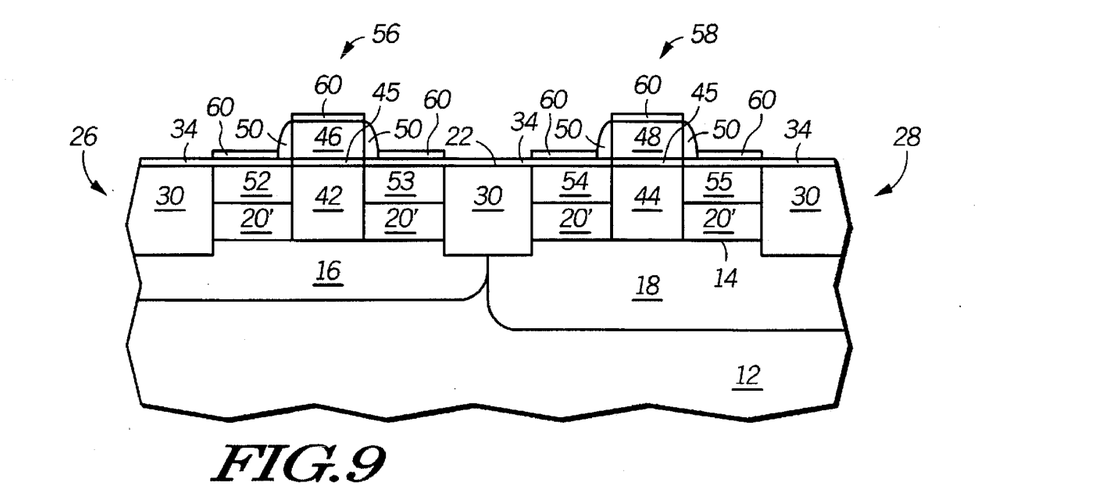

The fabrication of a CMOS device in accordance with the present embodiment of the invention is completed with the formation of heavily-doped source and drain regions in active regions 26 and 28, as illustrated in FIG. 9. After sidewall spacers 50 are formed, substrate 12 is selectively implanted with P-type dopants to form source and drain regions 52 and 53 in active region 26 on either side of first gate electrode 46. Correspondingly, active region 28 is selectively implanted with N-type dopants to form heavily-doped source and drain regions 54 and 55 in active region 28 on either side of second gate electrode 48. It is important to note that the ion implant processes used to form the source and drain regions create doped regions in active regions 26 and 28 having a peak concentration in the upper portion of the active regions. The source and drain regions are self-aligned to the sidewall spacers adjacent to the gate electrodes and to the channel regions. Further, the range of implanted dopants is constrained to the upper portion of active regions 26 and 28 such that remaining portions 20' of undoped epitaxial layer 20 vertically separate the source and drain regions from first and second buried layer 16 and 18.

Heavily-doped source and drain regions 52 and 53 are formed by masking off remaining portions of substrate 12 and implanting P-type dopants, such as boron, into active region 26 using sidewall spacers 50 adjacent to first gate electrode 46 as a doping mask. The implant energy used will depend upon the deposition thickness of undoped epitaxial layer 20. For example, for a deposited thickness of 1 to 2 microns, a boron implant energy of about 10 to 20 keV can be used. Correspondingly, N-type source and drain regions 54 and 55 are formed by masking off remaining portions of semiconductor substrate 12 and implanting an N-type dopant, such as phosphorous or arsenic, into active region 28. Again, sidewall spacers 50 adjacent to second gate electrode 48 function as an implant mask. Where the deposited thickness of undoped epitaxial layer 20 is about 1 to 2 microns, and arsenic is used to form source and drain regions 54 and 55, an implant energy of about 40 to 80 keV is used. The formation of source and drain regions 52 and 53 completes the fabrication of a P-type MOS transistor in active region 26. Further, the formation of source and drain regions 54 and 55 complete the fabrication of an N-channel MOS transistor 58 in active region 28.

Upon completion of the source drain formation process, remaining portion 20' composed of undoped, epitaxial silicon vertically separates the source and drain regions from first and second buried layers 16 and 18. By carefully controlling the implant energy, the range of dopants implanted into active regions 26 and 28 is constrained such that a maximum source and drain junction depth of about 0.1 to 0.2 microns is obtained. Meanwhile, the junction depth of first and second buried layers 16 and 18 is preferably about 0.3 to 0.4 microns. Accordingly, a region of intrinsic silicon remains vertically separating the source and drain regions from the buried layers.

Those skilled in the art will recognize that separating the source and drain regions from the buried layers by a region of intrinsic, undoped silicon will reduce the junction capacitance between the source drain regions and underlying silicon. The undoped epitaxial layer underlying the source and drain regions is comprised of silicon that is fully depleted of charge carriers. As a result of the vertical separation of the junctions, large capacitance across the electrical junction between the source drain regions and semiconductor substrate 12 does not arise. Although undoped silicon underlies the source and drain regions of each transistor, the transistors are fully isolated from remaining portions of substrate 12 and from each other by first and second buried layers 16 and 18, and by dielectric isolation region 30.

After formation of the source and drain regions, refractory metal silicide regions 60 are formed in the source and drain regions at upper surface 22. Additionally, refractory metal silicide regions are also formed at the upper surface of first and second gate electrodes 46 and 48. Preferably, refractory metal silicide regions 60 are formed by first depositing a layer of refractory metal, followed by thermal annealing to react-the refractory metal with silicon in the source and drain regions and the gate electrodes. For example, refractory metal silicide regions 60 can be formed by the deposition of a layer of titanium followed by thermal annealing at a temperature of about 600° C. to 700° C. The refractory metal silicide forming process does not form refractory metal silicide over insulating sidewall spacers 50. Therefore, the refractory metal silicide regions residing at the upper surface of first and second gate electrodes 46 and 48 are electrically isolated from the refractory metal silicide at the surface of the source and drain regions.

Figure 10:
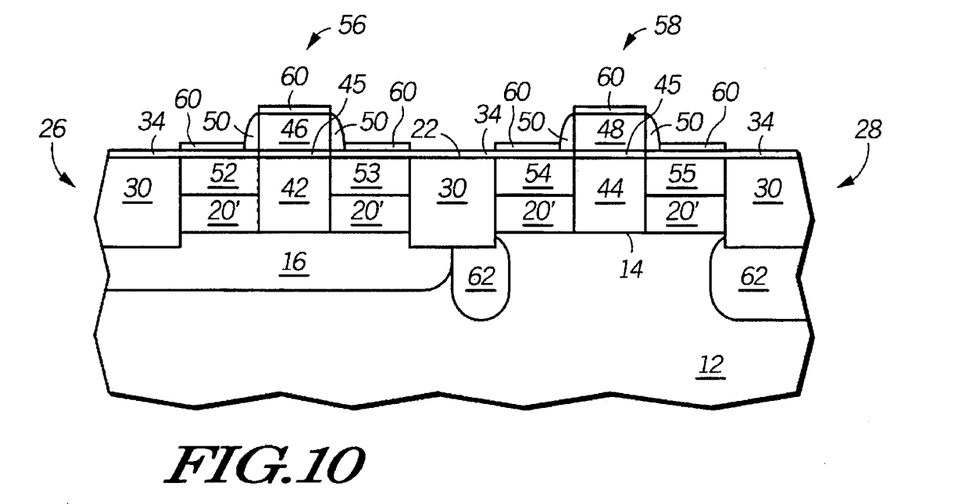
FIG. 10 illustrates, in cross-section, another embodiment of the invention having a separated buried layer.

Shown in FIG. 10 is another embodiment of the invention in which one buried layer is configured as an annular region in substrate 12 subtending a portion of dielectric isolation region 30 surrounding N-channel MOS transistor 58. Annular buried layer 62 is characterized by an internal diameter having a specified, predetermined distance in substrate 12. Annular buried layer 62 functions in conjunction with dielectric isolation regions 30 to provide electrical isolation for N-channel MOS transistor 58. Annular buried layer 62 is formed by confining implanted dopants to a region of semiconductor substrate 12 in which dielectric isolation region 30 is to be formed. The confinement of the buried layer to a region of substrate 12 in the vicinity of dielectric isolation regions 30 further enhances the performance of N-channel MOS transistor 58. By removing the high concentration of P-type dopants further away from source and drain regions 54 and 55, the junction capacitance is further reduced.

Figure 11:
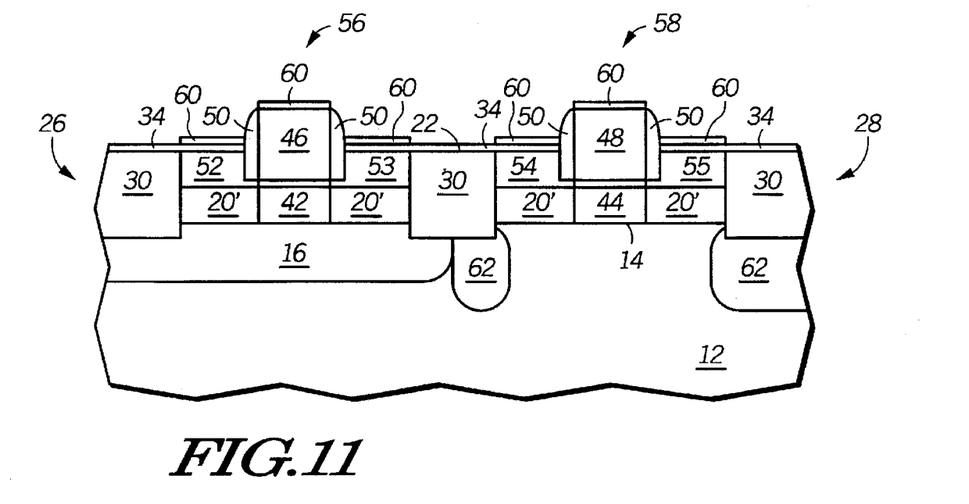
FIG. 11 illustrates, in cross-section, yet another embodiment of the invention having recessed gate electrodes.

Shown in FIG. 11 is yet another embodiment of the invention having recessed gate electrodes. The formation of MOS transistors 56 and 58 reduces the depth of the source and drain regions relative to the channel region. The relative change in dimensions of the transistor elements effectively reduces short-channel effects encountered in MOS transistors having sub-micron dimensions. Furthermore, the relative change in dimensions of the transistor elements reduces the series resistance in MOS transistors 56 and 58.

To form the recessed gate electrodes, active regions 26 and 28 are etched using openings 38 and 40 in masking layer 32, as illustrated in FIG. 6. After etching a recess into active regions 26 and 28, gate dielectric layer 45 is grown to overlie the surfaces of the recess and the gate forming material is deposited to fill the recess in first active region 26 and second active region 28. Subsequent processing continues as described for the fabrication of the embodiment illustrated in FIG. 9. To further reduce the parasitic capacitance in MOS transistors 56 and 58, insulating sidewall spacers 50 extend into the recess and separate gate electrodes 46 and 48 from the source and drain regions.

Thus it is apparent that there has been provided, in accordance with the invention, a CMOS device having reduced parasitic capacitance and a fabrication process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a conventional LOCOS isolation process can be used to form the dielectric isolation regions. It is therefore intended to include within the invention all such variations and modifications as fall within the scope of the appended claims and equivalents thereof.

We claim:

1. A process for fabricating a semiconductor device comprising the steps of:

providing a semiconductor substrate having an undoped silicon layer overlying a buried layer;

forming a trench isolation structure in the undoped silicon layer to define an active region therein;

forming a masking layer on the undoped silicon layer, the masking layer having an opening therein exposing a channel portion of the active region;

doping the channel portion with a first dopant, using the masking layer as a doping mask, wherein the first dopant extends from an upper surface of the undoped silicon layer to the buried layer;

depositing a layer of polycrystalline silicon to overlie the masking layer and the channel portion;

planarizing the polycrystalline silicon to form a gate electrode overlying the channel portion;

removing the masking layer; and forming source and drain regions in the undoped silicon layer on either side of the gate electrode, wherein the source and drain regions are vertically separated from the buried layer by a portion of the undoped silicon layer.

2. The process of claim 1, wherein the step of forming source and drain regions comprises ion implantation of dopant species, wherein the undoped silicon layer is deposited to a first thickness, and wherein the source region has a maximum junction depth which is less than the first thickness of the undoped silicon layer the drain region has a maximum junction depth which is less than the first thickness of the undoped silicon layer.

3. The process of claim 1 further comprising the step of etching a recess in the channel portion of the undoped silicon layer using the masking layer as an etching mask.

4. The process of claim 3 further comprising the step of forming insulating sidewall spacers adjacent to the gate electrode.

5. The process of claim 1, wherein the steps of providing a buried layer and forming a trench isolation structure comprise:

implanting the semiconductor substrate with a second dopant to form an annular doped region in the semiconductor substrate; and etching a trench in the undoped epitaxial layer such that the trench is subtended by the annular doped region.

6. A process for fabricating a semiconductor device comprising the steps of:

providing a semiconductor substrate having an undoped epitaxial layer overlying a buried layer of a first conductivity type;

forming a masking layer on the undoped epitaxial layer, the masking layer having an opening therein exposing a channel portion of the undoped epitaxial layer;

doping the channel portion with a dopant of the first conductivity type, using the masking layer as a doping mask;

forming a gate electrode in the opening; and forming source and drain regions in the undoped epitaxial layer on either side of the gate electrode, wherein the source and drain regions are vertically separated from the buried layer by a portion of the undoped epitaxial layer.

7. The process of claim 6, wherein the step of doping the channel portion comprises forming a continuous doped region extending from an upper surface of the undoped epitaxial layer to the buried layer.

8. The process of claim 6, further comprising the step of forming a dielectric isolation region in the undoped epitaxial layer, and wherein the step of providing a buried layer comprises forming a continuous doped region subtending the dielectric isolation region.

9. The process of claim 6 further comprising the step of etching a recess in the channel portion of the undoped epitaxial layer using the masking layer as an etching mask.

10. A process for fabricating a semiconductor device comprising the steps of:

providing a semiconductor substrate having a surface; forming a first buried layer of a first conductivity type at the surface;

forming a second buried layer of a second conductivity type at the surface adjacent to the first buried layer;

forming an undoped epitaxial layer overlying the first and second buried layers;

forming an isolation region in the undoped epitaxial layer to define a first active region overlying the first buried layer and a second active region overlying the second buried layer;

forming a masking pattern overlying the undoped epitaxial layer and the isolation region, the masking pattern having a first opening therein exposing a channel portion of the first active region and a second opening therein exposing a channel portion of the second active region;

doping the channel portion of the first active region with a dopant of the first conductivity type;

doping the channel portion of the second active region with a dopant of the second conductivity type;

forming a first gate electrode in the first opening and a second gate electrode in the second opening;

forming source and drain regions of the second conductivity type on either side of the first gate electrode; and forming source and drain regions of the first conductivity type on either side of the second gate electrode, wherein the source and drain regions of the second conductivity type are spaced apart from the first buried layer by a first portion of the undoped epitaxial layer, and wherein the source and drain regions of the first conductivity type are spaced apart frozen the second buried layer by a second portion of the undoped epitaxial layer.

11. The process of claim 10, wherein a portion of the isolation region surrounds the second active region, and wherein the step of forming a second buried layer comprises forming a continuous doped region subtending the portion of the isolation region.

12. The process of claim 10, wherein the step of doping the channel portion of the first active region comprises forming a doped region extending from the surface of the undoped epitaxial layer to the first buried layer.

13. The process of claim 10, wherein the step of doping the channel portion of the second active region comprises forming a doped region extending from the surface of the undoped epitaxial layer to the second buried layer.

* * * * *

UNITED STATES PATENT AND TRADEMARK OFFICE
CERTIFICATE OF CORRECTION

PATENT NO. : 5,627,097
DATED : May 6, 1997
INVENTOR(S) : Suresh Venkatesan, Stephen Poon and Jeffrey Lutze It is certified that error appears in the above-indentified patent and that said Letters Patent is hereby corrected as shown below:

Column 10, line 2, change "frozen", to --from--.

Signed and Sealed this

Twenty-third Day of December, 1997

Attest:

BRUCE LEHMAN

*Attesting Officer*   *Commissioner of Patents and Trademarks*